US005550354A

United States Patent [19]

Kimura et al.

[11] Patent Number: 5,550,354

[45] Date of Patent: Aug. 27, 1996

[54] HIGH-FREQUENCY INDUCTION HEATING COIL

[75] Inventors: Masanori Kimura; Hirotoshi Yamagishi, both of Gunma-ken, Japan

[73] Assignee: Shin-Etsu Handotai Co., Ltd., Tokyo, Japan

[21] Appl. No.: 456,102

[22] Filed: May 30, 1995

[30] Foreign Application Priority Data

May 31, 1994 [JP] Japan .................................... 6-141265

[51] Int. Cl.[6] .............................. H05B 6/40; C30B 13/20

[52] U.S. Cl. .......................... 219/673; 219/638; 219/674; 373/139

[58] Field of Search .................................... 219/638, 673, 219/674, 675; 373/139

[56] References Cited

U.S. PATENT DOCUMENTS

| | | | |
|---|---|---|---|
| 2,781,438 | 2/1957 | Griffith, Jr. | 219/674 |
| 4,506,132 | 3/1985 | Keller | 219/638 |
| 4,538,279 | 8/1985 | Keller | 219/638 |
| 5,394,432 | 2/1995 | Fukuzawa et al. | 373/139 |

FOREIGN PATENT DOCUMENTS

| | | | |
|---|---|---|---|
| 130426 | 3/1978 | Germany | 219/638 |
| 665411 | 5/1979 | U.S.S.R. | 219/638 |

*Primary Examiner*—Philip H. Leung
*Attorney, Agent, or Firm*—Ronald R. Snider

[57] ABSTRACT

A high-frequency induction heating coil is provided which enables a semiconductor single crystal in the process of growth to incorporate impurities uniformly therein, permits ready adjustment of the heat distributing property, and precludes the discharge of electricity across a slit. The high-frequency induction heating coil comprises a pair of annular conductors 21 and 22, a pair of power source terminals **23*a* and 23*b* for feeding a high-frequency electric current to the pair of annular conductors 21 and 22, and a plurality of small coils 24*a* through 24*f* and 25*a* through 25*f* having the pair of annular conductors as opposite electrodes and projecting toward the axis of the pair of annular conductors extending from a first annular conductor 21 to a second annular conductor 22**.

7 Claims, 4 Drawing Sheets

HIGH-FREQUENCY INDUCTION HEATING COIL

BACKGROUND OF THE INVENTION

1. Field of the Invention

This invention relates to a high-frequency induction heating coil for thermally fusing a raw material crystalline rod and more particularly to a high-frequency induction heating coil to be used for the growth of a semiconductor single crystal by the floating zone (FZ) method.

2. Description of the Prior Art

As a means for growing a semiconductor single crystal by an FZ method, the method which, as shown in FIG. 3, implements growth of a single crystalline rod 2 by setting fast a raw material polycrystalline rod 1 on the upper shaft and a seed of a single crystal of a small diameter on the lower shaft located directly below the raw material polycrystalline rod 1, encircling the raw material polycrystalline rod 1 with a high-frequency inducting heating coil 3, melting the raw material polycrystalline rod 1 and causing the seed crystal to immerse in the melt, and then reducing the diameter of the seed crystal thereby eliminating dislocation and meanwhile relatively rotating the raw material polycrystalline rod 1 to a heating coil 3 and moving the rod 1 in the axial direction has been well known heretofore. This growth method requires the raw material polycrystalline rod 1 to be quickly melted to the core in the narrowed molten zone. Meanwhile, for the purpose of enabling the single crystal 2 to grow stably after the zone melting without impairing uniform distribution of impurities, it is necessary that the front end of the solidified single crystal adjoining a molten zone 4 is caused to radiate heat slowly. To satisfy these requirements, a flat induction heating coil 3 as a pancake has been heretofore practically employed.

In the flat induction heating coils 3, those constructed as shown in FIG. 4 have been popularly recognized (as disclosed in JP-B-51-24,964, for example; hereinafter referred to as "first conventional technique"). In the heating coil 3 of this first conventional technique, an annularly shaped coil thereof is so formed that the cross section thereof gradually decreases in thickness toward the inner circumferential surface 7 side and opposed faces *5a, 5b* on the opposite end sides of the coil 3 provided with power source terminals *6a, 6b* on an outer circumferential surface 8 are close each other across a space 5 to the fullest possible extent. Owing to this construction, the coil 3 assumes symmetry of the current circuit thereof in the circumferential direction and acquires a practically uniform magnetic field distribution.

According to the heating coil 3 of the conventional technique shown in FIG. 4, since the space 5 of the heating coil 3 is formed along the faces perpendicular to the circumferential direction of the heating coil 3, an ununiform magnetic field is inevitably generated in the part in which the faces *5a, 5b* are opposed to each other across the space no matter how small the space may be. Further, since electric currents flow in mutually opposite directions along the radial direction near the opposed surfaces *5a, 5b*, the electromagnetic field in the vertical direction which affects the growth of crystal most seriously is doubled by the electric currents in the opposite directions and the ununiform magnetic field is all the more amplified.

When the raw material polycrystalline rod 1 and the heating coil 3 are rotated and moved relatively to each other in the presence of the ununiform magnetic field, layers containing impurities alternately in a high concentration and in a low concentration are repeatedly formed in each growth cycle per rotation owing to a local temperature difference caused by the ununiform magnetic field (hereinafter referred to as "rotational striation"). When a device is produced by the use of a single crystal containing such rotational striations, the microscopic variation of resistance in the rotational striation can cause property deviation in the product.

To eliminate this defect of the first conventional technique, a high-frequency induction heating coil 10 which, as shown in FIG. 5, has a plurality of slits *13a* through *13d* and *14a* through *14e* extended in the radial direction from the inner circumferential surface 17 side or from the outer circumferential surface 18 to halfway along the coil width (hereinafter referred to collectively as "slits 13, 14") throughout the entire thickness of the coil in the axial direction has been invented (JP-A-52-30,705, hereinafter referred to as the "second conventional technique"). In the heating coil 10 of the second conventional technique, the plurality of slits 13, 14 having the same width as a space 12 are so staggered and spaced circumferentially as to assume geometric periodicity. Consequently, the high-frequency electric current which flows on the surface of the heating coil 10 mentioned above is controlled symmetrically relative to the axis of the coil.

For the purpose of cooling the heating coil 10 of the second conventional technique constructed as shown in FIG. 5, however, it is necessary that the heating coil 10 is provided therein with flow paths capable of supplying cooling water between the inner circumferential surface 17 and the slits 14 or between the outer circumferential surface 18 and the slits 13. Thus, gaps are to be formed between the inner circumferential surface 17 and the slits 14 or between the outer circumferential surface 18 and the slits 13. When the high-frequency electric current flows along the slits 13 and 14, it takes the shortest route deviated inward from the ideal route by using the gaps between the circumferential surfaces and the slits. The heating capacity of the coil near the inner circumferential surface 17, therefore, is decreased in proportion to the size of the deviation. As a result, the convective stirring force in the central part of the molten zone 4 is weakened and the resistivity near the axis of the semiconductor single crystal 2 in process of growth is inevitably lowered.

To adjust the heat distributing property of the heating coil 10, the slits 13 and 14 must be varied in length and width. For the sake of this variation, the heating coil 10 must be elaborately remade. Thus, the adjustment of the heat distributing property cannot be readily carried out. Further, since the route for the electric current is long, the space 12 possibly discharges electricity near the power source terminals 15 and 16, so that the heating operation cannot be stably performed.

SUMMARY OF THE INVENTION

This invention has been produced in view of the true state of the crystalline growth by the FZ method using such high-frequency induction heating coil as mentioned above. It has an object for the provision of a high-frequency induction heating coil which permits uniform incorporation of impurities in a semiconductor single crystal, allows simple adjustment of the heat distributing property, and precludes possible discharge of electricity across a space.

This invention concerns a high-frequency induction heating coil which comprises a pair of annular conductors, a pair of power source terminals for supplying high-frequency electric currents to the pair of annular conductors, and a plurality of small coils using the pair of annular conductors as opposite electrodes, projecting toward the axis of the pair of annular conductors and extending from the first annular conductor to the second annular conductor.

The small coils are desired to be arranged symmetrically relative to the axis mentioned above. The small coils are desired to be arranged in a manner that a small coil having a long projection toward the axis and a small coil having a short projection toward the axis are arranged as one set. The small coils may have a conductor plate thereon which is provided with a slit at least opened to the circular conductor side, without contacting with other small coil or conductor plate.

The pair of annular conductors may be arranged on one plane or approximately parallelly to each other.

The small coils and the pair of annular conductors are desired to be formed in a tubular shape so that the small coils and the tubular conductors will permit flow of a refrigerant.

BRIEF DESCRIPTION OF THE INVENTION

This invention will be better understood and the objects, features, and advantages thereof other than those set forth above will become apparent when consideration is given to the following detailed description thereof, which makes reference to the annexed drawings wherein:

FIG. 1*a* and FIG. 1*b* illustrate the construction of one embodiment of this invention; FIG. 1*a* representing a plan view and FIG. 1*b* representing a cross section taken through the plan view along the A—A line.

DETAILED DESCRIPTION OF PREFERRED EMBODIMENTS

Figure 1A:
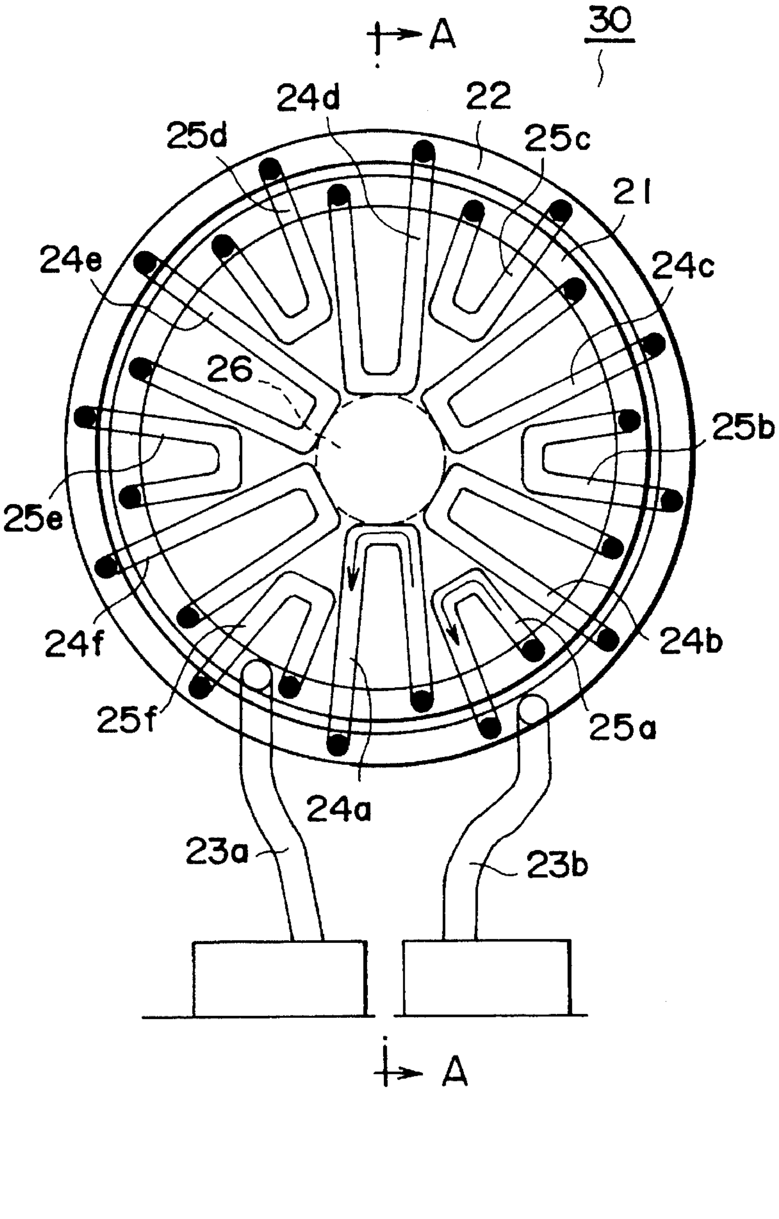

In the high-frequency induction heating coil according to this invention, a pair of annular conductors function as a second feed electrode and these annular conductors feed a high-frequency power to each of a plurality of small coils. This high-frequency induction heating coil, therefore, has no need to form in the power supply part thereof an axially asymmetrical space which possibly cause the occurrence of an ununiform magnetic field and is allowed to form an axially symmetrical magnetic field distribution with respect to the inside part of the pair of annular conductors.

When an axially symmetrical magnetic field distribution is formed, the molten zone is uniformly heated and consequently the generation of the above rotational striation owing to the temperature difference is suppressed and the microscopic variation of resistance in the semiconductor single crystal is reduced.

The small coils are conductors which use the pair of annular conductors as opposite electrodes and project toward the axis of the pair of annular conductors, extending from the first to the second annular conductor. When the small coils are formed symmetrically relative to the central position of the high-frequency induction heating coil, the molten zone is heated more uniformly and the generation of rotational striation is suppressed to a further degree and the microscopic variation of resistance in the semiconductor single crystal is reduced with increased certainty.

When a small coil having a longer projection toward the axis and a small coil having a shorter projection toward the axis are formed as one set, these small coils are enabled to be disposed very closely to the neck of the molten zone. Thus, the neck of the molten zone can be quickly and infallibly heated to a high temperature and the FZ method can be performed ideally.

When the small coils are so formed in shape and size and so arranged as to decrease gaps which intervene between the adjacent small coils, they collectively form one high-frequency induction heating coil. When these small coils have conducting plates thereon which are not allowed to contact with other small coil or conducting plate and are provided with a slit opened at least to the annular conductor side, the gaps mentioned above can be minimized and the heating of the molten zone can be further uniformized.

Since the small coils are arranged independently of one another, the axial symmetry of a variable magnetic field to be formed by the high-frequency electric current can be adjusted readily by changing the degree of projection at a particular small coil in need of adjustment.

Since the small coils are independently connected to the pair of annular conductors, the routes for electric current are short. Since this fact results in reducing the rise of voltage between the small coils, the heating of the molten zone can be stably effected without discharging electricity between the adjacent small coils or between the electrodes of each small coil itself.

Now, one embodiment of this invention will be described below with reference to FIG. 1 and FIG. 2.

Figure 1B:
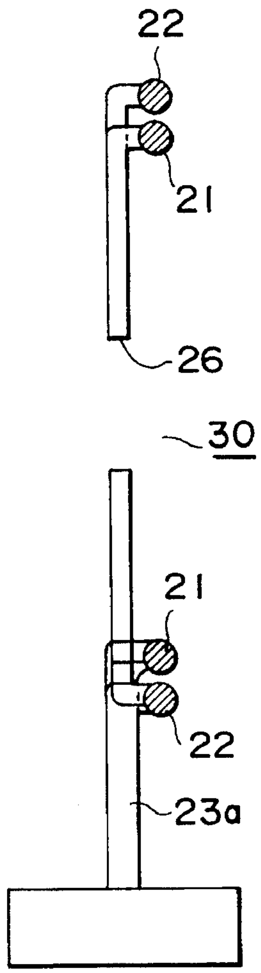
Figure 2:
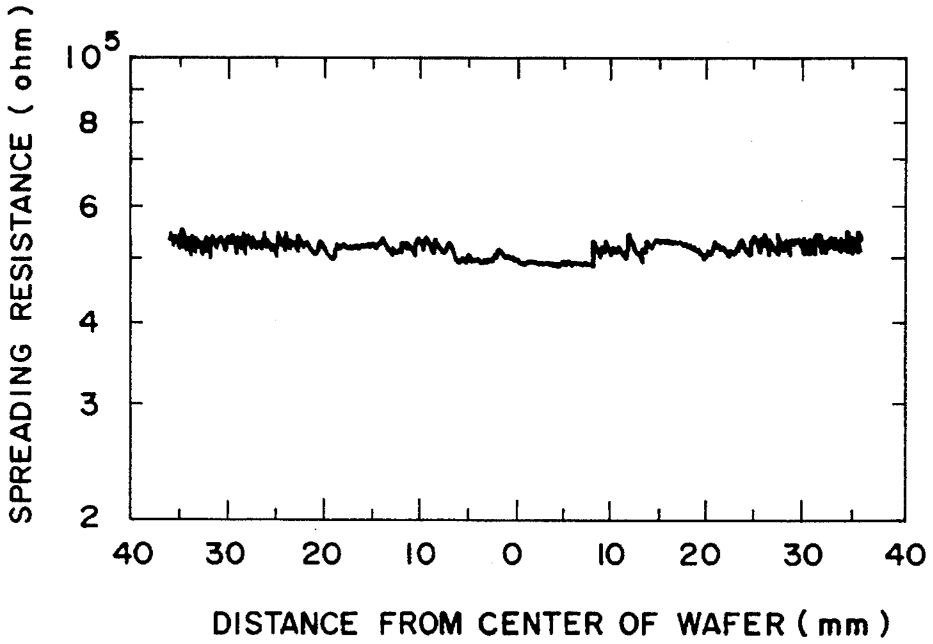
FIG. 2 is a graph showing the distribution of spreading resistance in the diametric direction in a silicon single crystal grown by the use of the embodiment.

FIG. 1*a* and FIG. 1*b* illustrate the construction of the present embodiment, FIG. 1*a* representing a plan view and FIG. 1*b* representing a cross section taken through the plan view along the A—A line and FIG. 2 is a graph showing the distribution of spreading resistance in the diametric direction in a silicon single crystal obtained by the use of a high-frequency induction heating coil 30 of the embodiment.

In the present embodiment, as shown in FIG. 1*a* and FIG. 1*b*, a first annular conductor 21 made of copper pipe and a second annular conductor 22 made of copper pipe slightly wider in diameter than the annular conductor 21 are coaxially arranged on one plane. A power source terminal 23*a* is connected to the first annular conductor 21 and a power source terminal 23*b* to the second annular conductor 22. These power source terminals are adapted so as to be supplied with high-frequency electric current while in operation.

Between these annular conductors 21 and 22, small coils 24*a* through 24*f* of long projection made of copper pipe are projected toward the coaxis of the annular conductors 21 and 22 and arranged symmetrically relative to the coaxis. Between the small coils 24*a* through 24*f*, small coils 25*a* through 25*f* of short projection are similarly formed. The molten zone 4 is formed in a hollow area 26 surrounded by the leading ends of the small coils 24*a* through 24*f*.

The pipes which form the small coils 24*a* through 24*f* and the small coils 25*a* through 25*f* and the pipes which form the annular conductors 21 and 22 are joined by any of the well-known methods such as silver soldering so as to communicate with one another and allow flow of cooling water therein. For example, the cooling water flows from the power source terminal 23*a* side, passes through the first annular conductor 21, flows practically simultaneously through the pipes of the small coils 24*a* through 24*f* and the small coils 25*a* through 25*f*, passes through the second annular conductor 22, and finally flows out from the power source terminal 23*b* side. In this manner, the high-frequency induction heating coil 30 is efficiently cooled.

Now, the production of a single crystal by means of the present embodiment will be described below.

Figure 3:
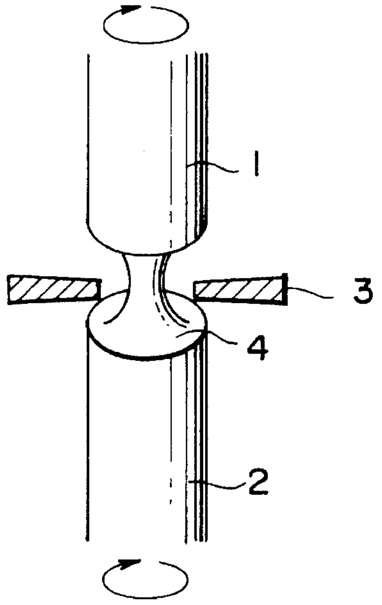
FIG. 3 is a schematic diagram showing the manner of growth of a semiconductor single crystal by the FZ method.

Similarly to the conventional technique which is shown in FIG. 3, a raw material polycrystalline rod 1 is so disposed above the high-frequency induction heating coil 30 according to the present embodiment that the molten zone 4 of the raw material polycrystalline rod 1 may be surrounded by the small coils 24*a* through 24*f* in the hollow region 26 mentioned above. When a high-frequency electric current is supplied between the power source terminals 23*a* and 23*b* of the high-frequency induction heating coil 30 shown in FIG. 1 which is in the state mentioned above, the high-frequency electric current flows to the small coils 24*a* through 24*f* and the small coils 25*a* through 25*f* between the first annular conductor 21 and the second annular conductor 22.

When the high-frequency electric current flows in the directions shown by arrow marks in FIG. 1, a magnetic field is formed in the empty space surrounded by the small coil 24*a* and the adjoining small coil 25*a* as overlapped in the direction piercing the plane of the paper from above to below owing to the Ampere's right-hand screw rule. Further, in the hollow region 26, a magnetic field is formed overlappingly in the direction piercing the plane of the paper from above to below owing to the electric current flowing through the leading end parts of the small coils 24*a* and 24*b*. Specifically, since the intensity of the magnetic field is not offset while the direction of the magnetic field is varied with a minute period at a given moment, the total amount of heat generated by this coil as a whole is practically equal to that of the conventional high-frequency induction heating coil.

The magnetic field is similarly formed in each of the other small coils 24*b* through 24*f* and the small coils 25*b* through 25*f* and these magnetic fields are wholly overlapped. In the hollow region 26 mentioned above, therefore, equal magnetic fields are formed in the direction piercing the plane of the paper from above to below. Thus, around the hollow region 26, the magnetic fields are symmetrically formed relative to the axis. When the directions of flow of electric currents through the small coils 24*a* through 24*f* and 25*a* through 25*f* are changed, the directions of the magnetic fields which are formed within the annular conductors 21 and 22 are inverted. The variable magnetic fields are formed symmetrically relative to the axis of the hollow region 26 as described above in response to the high-frequency electric currents which are supplied to the power source terminals 23*a* and 23*b*.

Eddy currents of the Lenz's law flow in the raw material polycrystal 1 and the molten zone 4 disposed in the hollow region 26 which has axially symmetrical variable magnetic fields formed therein. The raw material polycrystalline rod 1 and the molten zone 4 are heated by the Joule heat which is generated by the eddy currents. Then, the semiconductor crystalline rod 2 is produced by rotating the raw material polycrystalline rod 1 relatively to the high-frequency induction heating coil 30 and meantime moving the single crystal 2 along the axis thereof relative to the heating coil 30 mentioned above.

The silicon single crystal 2 produced by the use of the high-frequency induction heating coil 30 according to the present embodiment is tested by spreading resistance as the function of the distance from the axis of the silicon single crystal 2 in accordance with the specification of ASTM F525 (1977). The results of this test are shown in FIG. 2. It is remarked from the data that the magnitude of spreading resistance is practically uniform. This fact clearly indicates that the high-frequency induction heating coil of this invention permits suppression of the microscopic variation of resistance.

In the present embodiment, samples of the high-frequency induction heating coil 30 of this invention having a fixed diameter of 35 mm for the hollow region 26, varying outside diameters in the range of from 150 mm to 200 mm for the second annular conductor 22, and varying outside diameters in the range of from 120 mm to 170 mm for the first annular conductor 21 were tested. Among other samples, the sample having an outside diameter of 180 mm for the second annular conductor 22 and an outside diameter of 150 mm for the first annular conductor 21 was found to have produced the optimum results.

Figure 4:
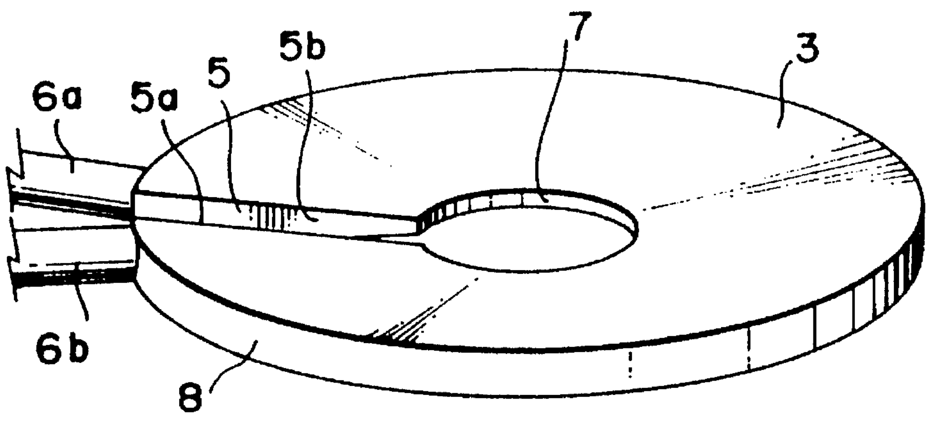
FIG. 4 PRIOR ART
FIG. 4 is a perspective view showing the construction of a conventional high-frequency induction heating coil.
Figure 5:
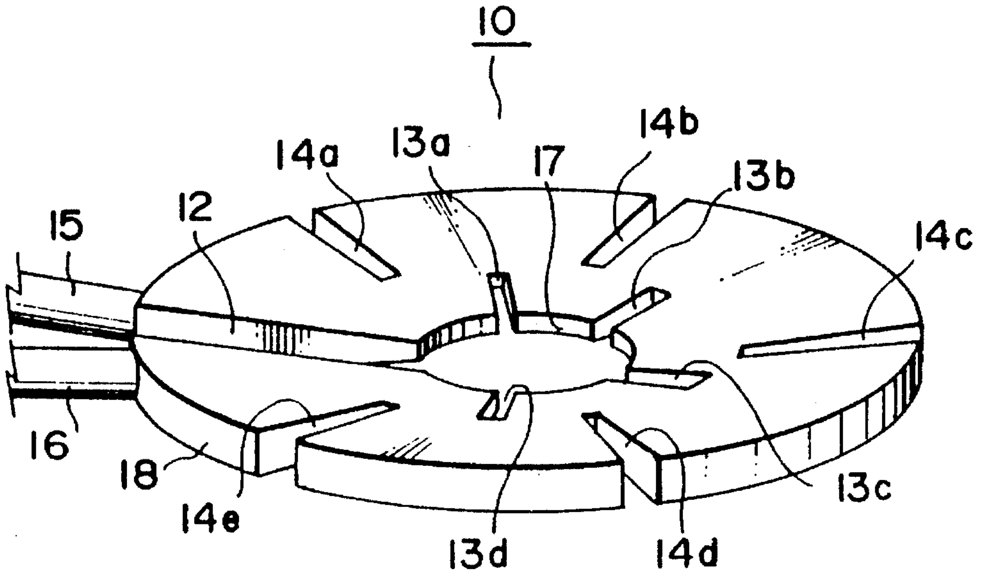
FIG. 5 PRIOR ART
FIG. 5 is a perspective view showing the construction of another conventional high-frequency induction heating coil.
Figure 6:
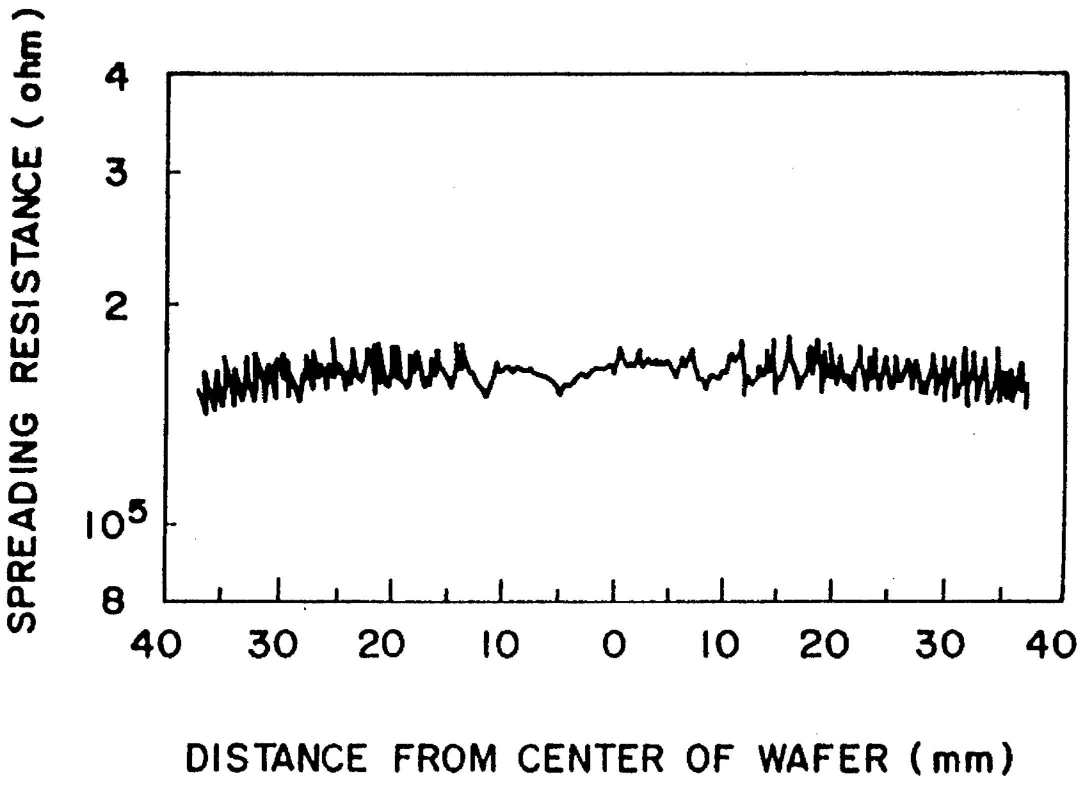
FIG. 6 PRIOR ART
FIG. 6 is a graph showing the distribution of spreading resistance in the diametric direction in a silicon single crystal produced by the use of a conventional high-frequency induction heating coil.

FIG. 6 shows the distribution of spreading resistance in the radial direction in a silicon single crystal obtained by the use of a conventional high-frequency induction heating coil 3 shown in FIG. 4. The data clearly indicate that the range of variation of the magnitude of resistance is considerably large as compared with that of the present embodiment.

The present embodiment described above represents a case of having the pair of annular conductors arranged on one and the same plane. This invention is not limited to this embodiment. It is permissible to have the pair of annular conductors arranged practically parallelly to each other as separated by a desired distance from each other.

When a given small coil of the present embodiment has a conducting plate thereon which is not allowed to contact with other small coil or conducting plate and is provided with a slit opened at least to the annular conductor side, the gap mentioned above can be minimized and the molten zone can be heated with further increased uniformity.

Further, the present embodiment has been described as a case of using annular conductors of a circular shape. The present invention does not need to be limited to this embodiment. The conductors may be in the shape of a regular hexagon, for example. As the material for the annular conductors and the small coils, silver material, steel material, silver-plated copper material, and silver-plated steel material may be used besides copper material.

In the high-frequency induction heating coil of the present invention, an axially asymmetrical space which possibly cause an ununiform magnetic field does not need to be formed at the power feed part and an axially symmetrical magnetic field distribution can be formed with respect to the region inward from the pair of annular conductors mentioned above, because the pair of annular conductors function as the second power feed electrode and the annular conductors feed a high-frequency power to each of the plurality of small coils as described above. As a result, the generation of the rotational striation can be reduced and the microscopic variation of resistance in the semiconductor single crystal can be suppressed.

Further, by suitably varying the lengths of projection of the small coils 24*a* through 24*f* and 25*a* through 25*f* toward the axis, the delicate adjustment of the axial symmetry of variable magnetic fields can be effected with simplicity. Since the small coils are independently connected to the pair of annular conductors and the routes for the electric current are short, the possible rise of voltage between the small coils can be suppressed and the crystal under production can be stably heated without inducing discharge of electricity between the small coils or between the electrodes of each small coil itself.

While there has been shown and described a preferred embodiment of the invention, it is to be distinctly understood that the invention is not limited thereto but may be otherwise variously embodied and practiced within the scope of the following claims.

What is claimed is:

1. A high-frequency induction heating coil comprising;

a pair of annular conductors;

a pair of power source terminals for feeding a high-frequency electric current to said pair of annular conductors;

a plurality of small coils each having one end electrically connected to one of said pair of annular conductors and another end connected to another of said pair of annular conductors and projecting toward an axis of the pair of annular conductors; and wherein one power source terminal is connected to only one annular conductor, and another power source terminal is connected to only another annular conductor.

2. The high-frequency induction heating coil according to claim 1, wherein said small coils are arranged symmetrically relative to said axis.

3. The high-frequency induction heating coil according to claim 1, wherein said small coils comprise a plurality of small coils of long projection toward said axis and a small plurality of coils of short projection toward said axis are arranged.

4. The high-frequency induction hearing coil according to claim 3, wherein said small coils of long projection have a conducting plate thereon not allowed to contact with other small coils or conducting plates and provided with a slit opened at least to the annular conductor side.

5. The high-frequency induction heating coil according to claim 1, wherein said pair of annular conductors are arranged on one and the same plane.

6. The high-frequency induction heating coil according to claim 1, wherein said pair of annular conductors are arranged practically parallelly to each other.

7. The high-frequency induction heating coil according to claim 1, further comprising a source of refrigerant, and wherein said small coils and said pair of annular conductors are made of pipes and said small coils and said pair of annular conductors pass said refrigerant therein.

* * * * *